(12) United States Patent
Markovich et al.

(10) Patent No.: US 6,264,851 B1
(45) Date of Patent: Jul. 24, 2001

(54) SELECTIVE SEED AND PLATE USING PERMANENT RESIST

(75) Inventors: Voya R. Markovich, Endwell; William E. Wilson, Waverly; Michael Wozniak, Vestal, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/042,876

(22) Filed: Mar. 17, 1998

(51) Int. Cl.[7] .................................................. C23F 1/00
(52) U.S. Cl. .................. 216/39; 216/17; 216/18; 216/20; 216/34; 216/35; 216/38; 216/49; 216/100; 216/108; 216/52; 216/53; 216/88; 427/97; 427/98
(58) Field of Search .................. 216/17, 18, 20, 216/34, 35, 38, 39, 49, 100, 108, 52, 53, 88; 427/97, 98

(56) References Cited

U.S. PATENT DOCUMENTS

| | | | |
|---|---|---|---|
| 3,011,920 | 12/1961 | Shipley, Jr. | 117/213 |
| 3,772,056 | 11/1973 | Polichette et al. | 117/47 A |
| 3,772,078 | 11/1973 | Polichette et al. | 116/212 |
| 3,783,005 | 1/1974 | Kenney | 117/212 |
| 3,791,858 * | 2/1974 | McPherson et al. | 216/20 |
| 3,846,168 * | 11/1974 | Elmore | 216/20 |
| 3,993,799 | 11/1976 | Feldstein | 427/53 |
| 4,151,313 * | 4/1979 | Wajima et al. | 427/98 |
| 4,325,983 * | 4/1982 | Feldstein | 427/98 |
| 4,358,479 * | 11/1982 | Canestaro et al. | 216/20 |
| 4,512,829 * | 4/1985 | Ohta et al. | 216/17 |
| 4,554,182 * | 11/1985 | Bupp et al. | 216/34 |
| 4,604,799 | 8/1986 | Gurol | 29/897 |
| 4,775,611 | 10/1988 | Sullivan | 430/314 |
| 4,781,788 * | 11/1988 | Forsterling et al. | 156/630 |
| 4,931,148 * | 6/1990 | Kukanskis et al. | 204/15 |
| 5,118,385 * | 6/1992 | Kumar et al. | 156/644 |
| 5,178,914 * | 1/1993 | Goldblatt et al. | 427/306 |
| 5,308,796 * | 5/1994 | Feldman et al. | 437/200 |
| 5,457,079 * | 10/1995 | Itabashi et al. | 502/331 |
| 5,670,011 * | 9/1997 | Togawa et al. | 216/88 |
| 5,670,425 * | 9/1997 | Schinella et al. | 437/195 |
| 5,759,427 * | 6/1998 | Cibulsky et al. | 216/91 |
| 5,789,320 * | 8/1998 | Andricacos et al. | 438/678 |
| 5,891,513 * | 4/1999 | Dubin et al. | 427/98 |

FOREIGN PATENT DOCUMENTS

| | | | |
|---|---|---|---|
| 591885 A * | 2/1960 | (CA) | 216/20 |
| 62-271491 A * | 11/1987 | (JP) . | |
| 62-297472 A * | 12/1987 | (JP) . | |
| 03-201592 A * | 9/1991 | (JP) . | |
| 05-226832 A * | 9/1993 | (JP) . | |

OTHER PUBLICATIONS

Grant, Julius, ed., "Hackh's Chemical Dictionary" 4th ed., McGraw–Hill, Inc., 1972. p. 462 & 543.*
Cho, James S.H. et al, "Electroless Cu for VLSI" MRS Bulletin, pp 31–38, Jun. 1993.*

* cited by examiner

*Primary Examiner*—Randy Gulakowski
*Assistant Examiner*—Michael Kornakov
(74) *Attorney, Agent, or Firm*—Salzman & Levy; Lawrence R. Fraley (57) ABSTRACT

The present invention is for a method wherein a printed circuit board can be fabricated in an electroless process with a minimum number of manufacturing steps using mild etchant conditions on an intermediary seed layer to produce low-defect, fine conductive line printed circuit boards.

8 Claims, 7 Drawing Sheets

SELECTIVE SEED AND PLATE USING PERMANENT RESIST

FIELD OF THE INVENTION

The present invention relates generally to the field of microelectronics (e.g., integrated circuits and printed circuit boards), and more particularly to compositions and methods for etching materials from the upper surface of resist layers previously applied to silicon or polymer substrates for the purpose of creating fine-line conductive lines on integrated circuits or circuit boards.

BACKGROUND OF THE INVENTION

Fine-line conductive lines must be manufactured for PC boards and cards with high quality, especially with regard to potential defects such as short or open circuits. These defects cause significant waste and are increasingly a problem as the line width becomes narrower and the density of these lines increases on the substrate. As is understood in the industry, the creation of discrete, fine conductive lines requires the formation of discontinuous areas, yet the conductive materials are typically applied in the form of a continuous, uniform layer via a process such as sputtering or electrolytic deposition. To convert this uniform layer into discontinuous areas, a process such as etching is typically required at some point during manufacturing.

The conductive lines can be created by either an additive or a subtractive process. When the subtractive process is employed, the conductive layer is applied to the substrate followed by a uniform application of resist material. The resist material is subsequently imaged and developed to form discontinuous areas on the conductive layer. The areas of the conductive layer that are uncovered by this process can be chemically etched, leaving a resist-covered fine line or pattern. Removal of the remaining resist creates the final coated substrate.

This process is complicated by a number of factors. For example, manufacture of high resolution printed wire boards cannot easily achieve sufficient resolution and bonding to the substrate laminate. The photoresist imaging step further requires that the conductive layer be free of minute scratches which could cause the photoresist to bridge over the top and thereby be undercut by the etchant. significantly, most of the conductive material foil initially applied must be etched away, causing significant waste handling problems. Furthermore, since the etching process is not completely anisotropic, the conductive fine lines can be undercut causing potential adhesion problems.

For the reasons cited hereinabove, the prior art has beneficiently utilized the process of additive circuitry. For example, additive circuits have been formed on an insulated, generally flat panel substrate, wherein the unclad substrate is electroless plated overall with a thin conductive layer, then photopatterned with a plating resist pattern covering part of the plating to define the primary circuit wiring pattern. The exposed plating is then electroplated to increase the thickness of the conductors. The conductors are then permanently defined by removing the plating resist and etching the thin electroless copper now resident between the conductor fine lines. This type of process is known as semi-additive, in that electroplating is used.

Fully additive circuits have been made in the prior art by using a seeded flat panel substrate laminate, which catalyzes that insulation, making it receptive to electroless copper deposition, thereby permitting conductors to be formed by imaging a permanent plating resist onto the substrate laminate. When electroless plated, the conductors are formed on the substrate laminate only where not covered by the resist. This process eliminates several of the problems associated with the subtractive process, but still requires etching of the seed layer.

One significant limitation for the production of fine-line conductive lines is the fragility of the conductive layer tracing and its susceptibility to damage from handling during manufacturing. The etching process is the most likely cause of such damage, since it is typically performed by mechanical grinding or using harsh chemical etchants. These processes, especially mechanical grinding, create debris that can cause shorting of the circuits if proper cleaning is not employed, or can create open circuits if the grinding cuts through the fine lines or causes delamination. It is understood that the thinner the layer to be etched or the milder the conditions of the etching process, the less likely will these defects occur. Therefore, there is an ongoing desire for improvements in this process.

The conductive layer and subsequently derived fine lines and patterns are typically made using copper metal. However, copper provides poor adhesion to substrates such as silicon or silicon dioxide wafers or polymer substrates. This is especially the case if dirt, scratches, or undercutting occurs. In these situations there is a likelihood of generating open circuits. To correct this defect, additional steps are performed, involving depositing a seed layer. Prior art references cite reactive metals such as palladium or chromium for this application, but these metals are expensive.

It can therefore be seen that there is a need in the art for a process to produce printed circuit boards and integrated circuits with a minimum number of steps, which process is cost efficient, environmentally nonhazardous and allows for the creation of high quality fine-line circuits having minimal circuit defects.

SUMMARY OF THE INVENTION

In accordance with the present invention, a method has been developed wherein a printed circuit board can be fabricated in an electroless process with a minimum number of manufacturing steps using mild etchant conditions on an intermediary seed layer to produce low-defect, fine conductive line printed circuit boards.

The present invention provides a method for controllably and uniformly generating a thin seed layer over the surface of an imaged and developed photoresist-coated substrate base. The thin seed layer can be composed of various materials such as nickel, copper, cobalt, chromium or noble metals such as palladium. Methods for applying the seed layer in the instant invention are described in U.S. Pat. No. 3,993,799 issued to Feldstein; U.S. Pat. No. 3,783,005 issued to Kenney; U.S. Pat. Nos. 3,772,055 and 3,772,078 issued to Polichette et al; and U.S. Pat. No. 3,011,920 issued to Shipley. Since the present invention employs an additive process, minimal quantities of raw materials, especially copper, are required and therefore the process generates significantly less waste associated with etching the thick copper plating that is typically required in the subtractive process.

The present invention provides a method for selectively etching the seed layer covering a photoresist layer using a combination of mechanical grinding and chemical etching. Minimal grinding is required, since the seed layer is very thin compared to prior art electroplated layers. To assist and facilitate the removal of the seed layer, mild chemical etchants can also be employed. Since only minimal grinding is required, the impact to the environment is low.

The present invention provides a method that does not require a highly planar base substrate, since in the grinding process, elevated areas are easily removed, creating substantially planar topmost surfaces.

The present invention provides a circuit board that contains a high density of fine conductive pathways due to excellent adhesion of the conductive material to the seed layer. The prior art processes require a uniform seed layer to be deposited on the substrate. After subsequent steps to generate the copper lines, all remaining uncovered seed layer must be removed before further processing can occur (e.g., gold plating wirebond pads). This prior art process causes undercutting of the copper lines and is especially problematic as the line spacing becomes tighter. The present invention completely eliminates this part of the process since no seed layer is present between the copper lines, therefore only top surface etching is required and no undercutting can occur.

The present invention also provides a printed circuit board that does not require having to prepare recesses in the circuit board for providing protective insulation between circuits. These recesses require laser ablation as taught in U.S. Pat. No. 4,604,799, issued to Gurol.

The present invention provides for a method of fabricating printed circuit boards, which method has a low defect rate, since minimal grinding and etching reduces the probability of generating debris that can cause shorting. Furthermore, the chemical etchant contains no physically abrasive materials and constantly flushes the surface, so that any debris is washed off during the etching process.

The present invention does not require application of a thick photoresist layer, since very mild grinding is utilized and only minimal reduction in the resist height occurs. In this invention the resist layer is only approximately 1 mil in thickness, compared to other systems (e.g., U.S. Pat. No. 4,775,611, issued to Sullivan), where >6 mil is required.

The present invention does not require the need for electroplating a thick copper layer on an entire circuit board surface. Electroplating is expensive, due to material and energy costs, and is wasteful, since most of the copper is later removed, causing delamination problems.

The above and additional advantages of the present invention will become apparent to those skilled in the art from reading the following detailed description when taken in conjunction with the accompanying drawings.

BRIEF DESCRIPTION OF THE DRAWINGS

A complete understanding of the present invention may be obtained by reference to the accompanying drawings, when considered in conjunction with the subsequent detailed description, in which.

DESCRIPTION OF THE PREFERRED EMBODIMENT

The present invention provides a method of production of fine-line conductive lines, patterns and connections. Refer now to FIGS. 1A–1H. Although numerous embodiments of the method are possible, the preferred embodiment of the method of production of fine-line conductive lines, patterns and connections comprises the steps of a) applying a copper foil to an insulating base substrate using heat and pressure to bond the foil to the base.

b) removing the copper foil leaving the substrate having an irregular surface that will allow excellent adhesion for the subsequent photoresist copper and seed layers.

c) applying a layer of photoresist material to the irregular surface of an insulating base substrate;

d) patterning the photoresist material by imaging and then developing the exposed photoresist material to create openings in the photoresist. The openings having sidewalls of unexposed photoresist and a bottom that comprises the insulating base substrate;

e) creating a layer of seed material that covers all exposed surfaces of the remaining photoresist layer and the sidewalls and bottom of the opening;

f) selectively etching the seed layer from the topmost surface of the photoresist using chemical-mechanical means, while leaving intact the seed layer in the sidewalls and bottoms of the openings; and g) applying a conductive material by electroless plating whereby the conductive material plates exclusively on the seed layer surface.

Figure 1A:
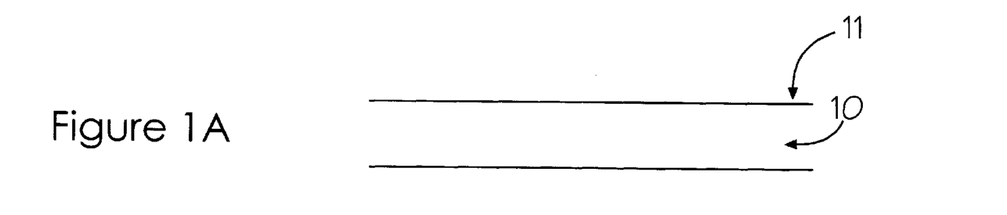
FIGS. 1A–1K depict sequential steps in producing fine line conductive lines in accordance with the present invention.

Specifically, FIG. 1A depicts an insulating base substrate, 10, typically made from a resin and fiberglass material and having a smooth surface 11.

Figure 1B:
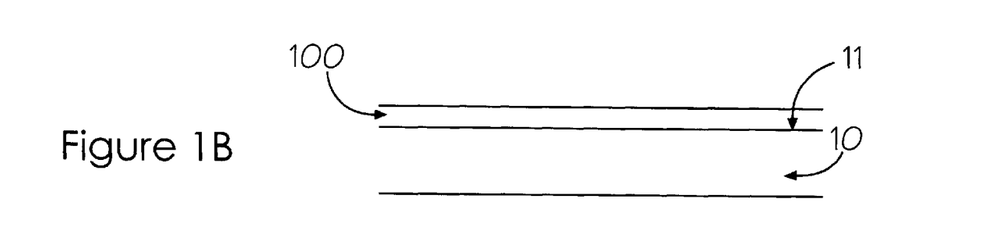

FIG. 1B shows a copper thin film, 100, in intimate contact with the substrate surface 11.

Figure 1C:
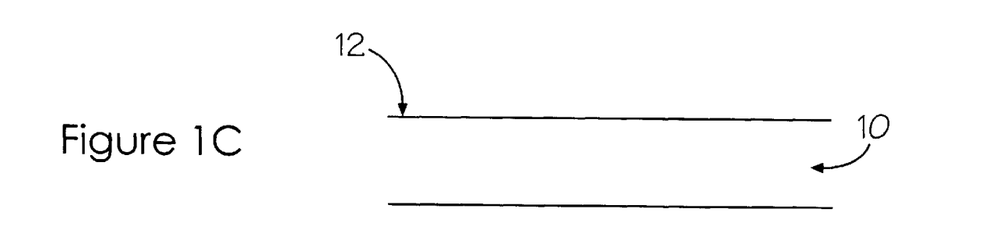

FIG. 1C depicts the resin/fiberglass base substrate 10 after removal of the copper foil, creating a new surface, 12, for the base substrate 10.

Figure 1D:
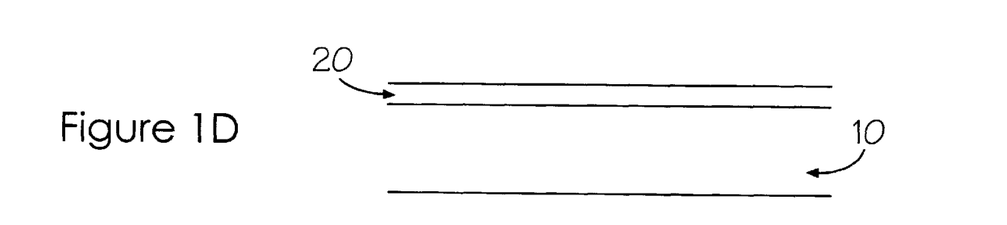
Figure 1E:
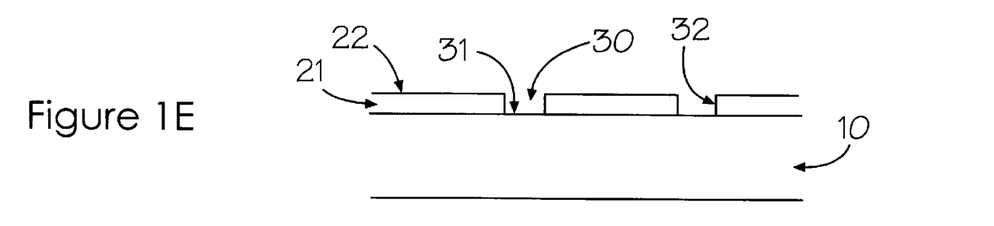

Specifically, FIG. 1D shows a photoresist layer 20 applied over an insulating base substrate 10. FIG. 1E shows the photoresist layer 21 after patterning to create openings 30 having bottoms 31 and sidewalls 32. The surface of the insulating base 10 constitutes the bottoms of the openings 30.

Figure 1F:
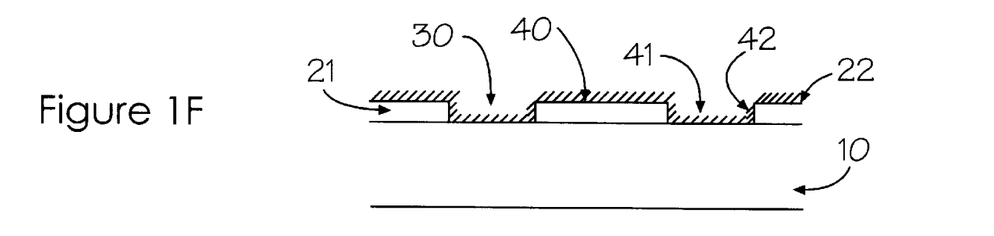
Figure 1G:
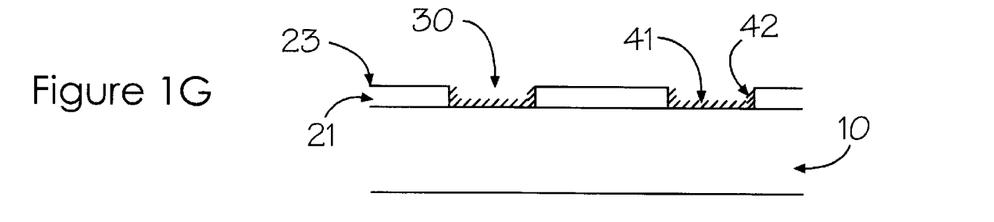
Figure 1H:
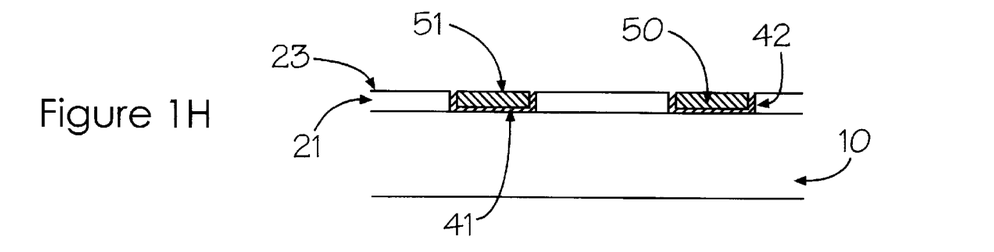

FIG. 1F shows the resultant structure after application of the seed layer 40 to the surface of the photoresist 22 and the bottom 41 and sidewall 42 surfaces within the openings 30. FIG. 1G shows the resultant structure after chemical-mechanical etching creates a new upper photoresist surface 23 by removing the seed layer 40 covering this surface 22. FIG. 1H shows the resultant structure after electroless plating on the remaining seed layers on the bottoms 41 and sidewalls 42 of the openings 30 are filled with conductive material 50 having an upper surface 51.

Figure 1I:
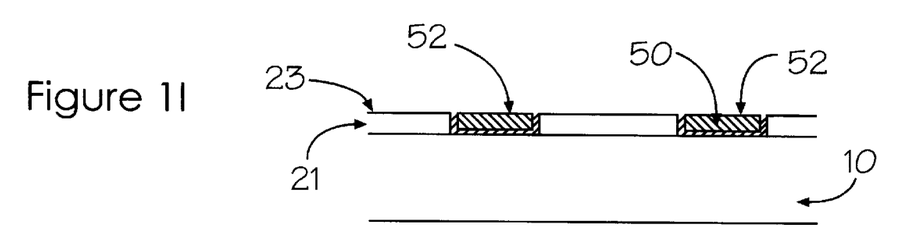
Figure 4A:
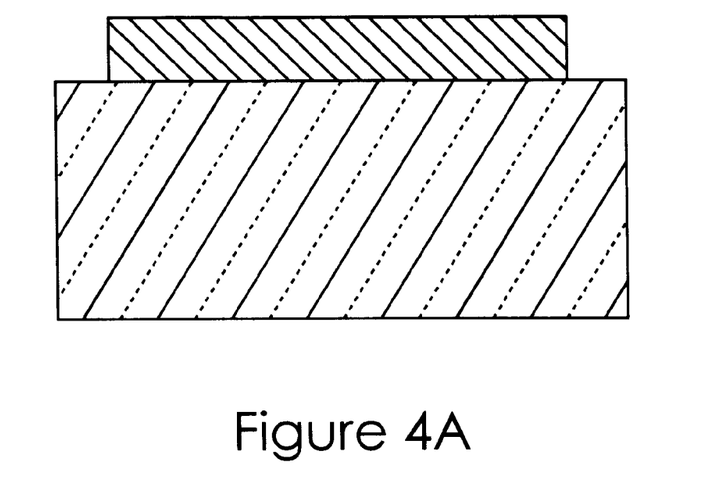
FIG. 4A is a cross-sectional view of a circuit line after the polishing of the glass plate, see step (b) below.
Figure 4B:
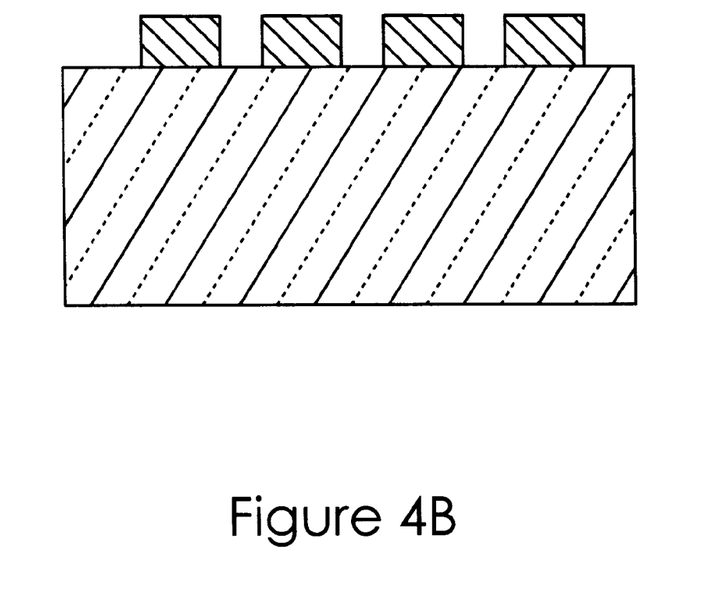
FIG. 4B is a front view of a circuit line after the polishing of the glass plate, see step (h) below.

A second embodiment comprises all of the aforementioned steps (a) through (g), and adds the additional step (h) of polishing the surface of the conductive layer 51 creating a new surface 52 as depicted in FIG. 1I and shown in the photographic representations FIGS. 4A and 4B.

Figure 1J:
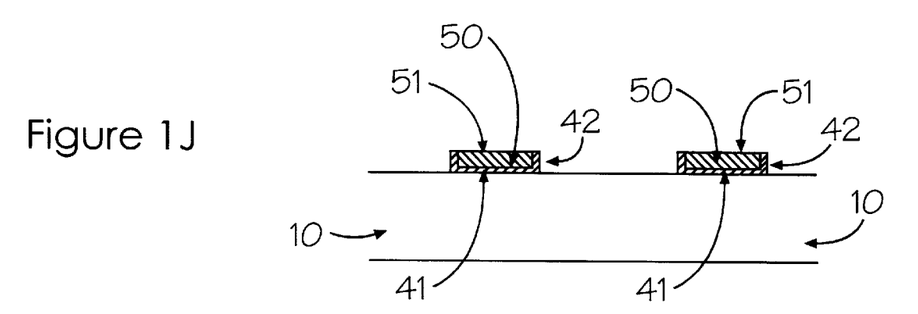

A third embodiment comprises all of the steps (a) through (g) above, and adds the additional step (i) of removing the patterned photoresist creating surface 51 as is depicted in FIG. 1J.

Figure 1K:
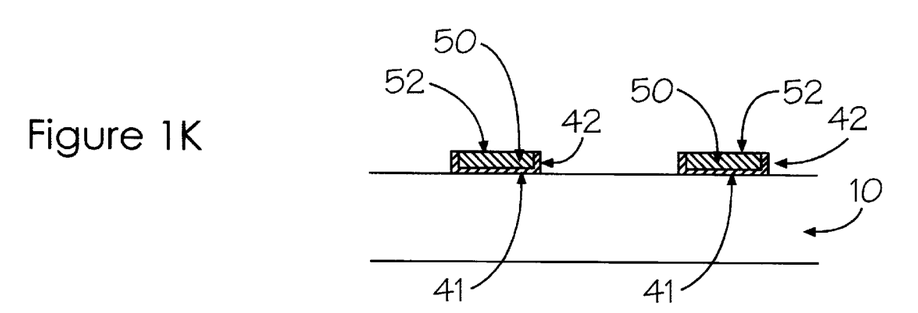

A fourth embodiment comprises all of the steps (a) through (h) of the second embodiment, above, and adds the additional step (j) of removing the patterned photoresist, creating the surface 52 as depicted in FIG. 1K.

A fifth embodiment comprises all of the steps (a) through (g) of the first embodiment and adds the following steps:

k) applying a layer of photoresist material 60 to the top surface of the product of step (g);

l) patterning this photoresist material from step (k) by imaging and developing the exposed photoresist materials to create openings in the photoresist. The openings have sidewalls of unexposed photoresist and a bottom that comprises the topmost surface of first patterned photoresist or first conductive material;

m) creating a layer of seed material that covers all exposed top surfaces of the patterned photoresist layer from step (l) and the sidewalls and bottom surfaces of the openings from step (l);

n) etching the seed layer from the topmost surface of the patterned photoresist layer form step (m) using chemical-mechanical means while leaving intact the sidewalls and bottoms of the openings formed in step (l); and o) applying a conductive material by electroless plating, whereby the conductive material plates exclusively on the seed layer surface.

Figure 2A:
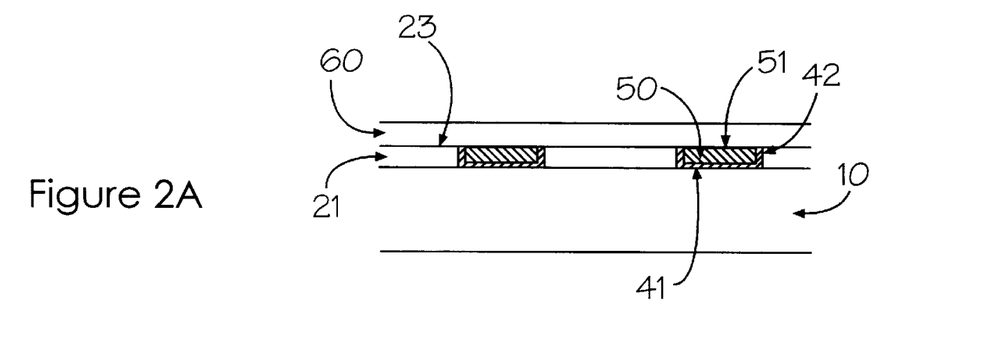
FIGS. 2A–2E depict an alternative embodiment of the inventive steps.
Figure 2B:
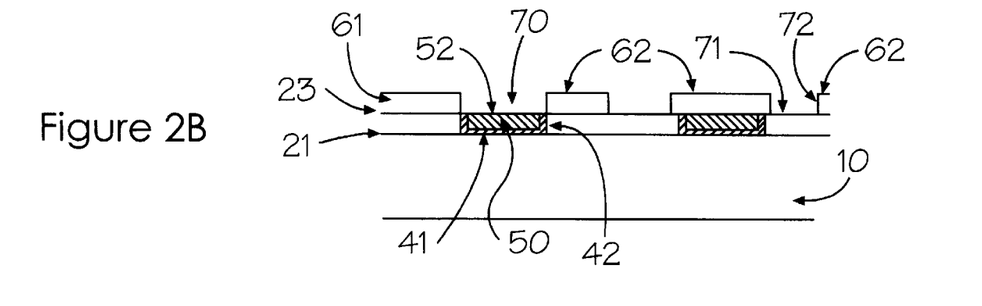
Figure 2C:
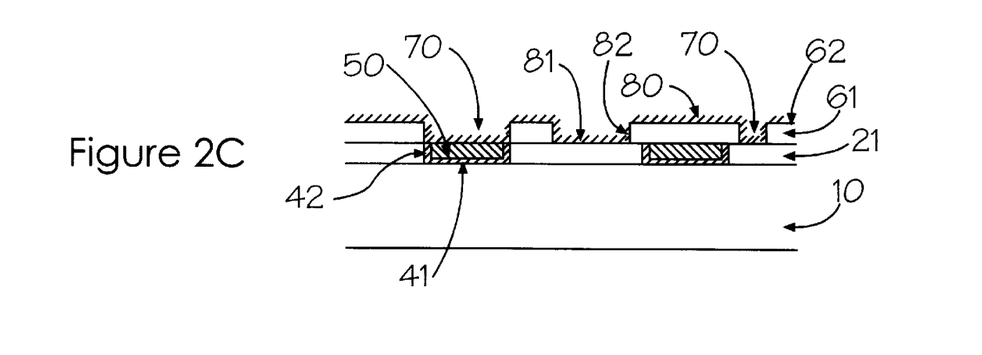
Figure 2D:
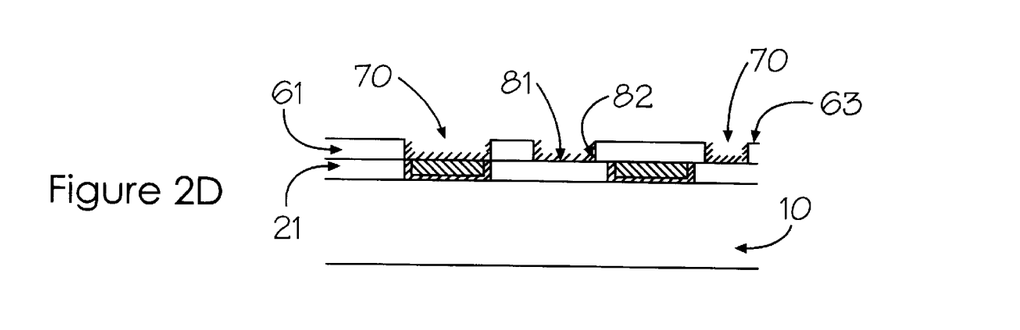

The foregoing embodiment is illustrated in FIGS. 1A through 1H and 2A through 2E. FIG. 2A shows the second photoresist layer 60 applied over the top surface 23 of the first photoresist 21. FIG. 2B shows the second photoresist layer 61 after patterning to create opening 70 having sidewalls 71 of patterned second photoresist 61 and bottoms of first patterned photoresist 21 and the topmost surface 52 of conductive material 50. FIG. 2C illustrates the resultant structure after application of the second seed layer 80 to the topmost surface 62 of the second photoresist 61 and the bottoms 81 and sidewalls 82 of the openings 70. FIG. 2D shows the resultant structure after chemical-mechanical etching creates a new upper photoresist surface 63 by removing the seed layer 80 that covers this surface.

Figure 2E:
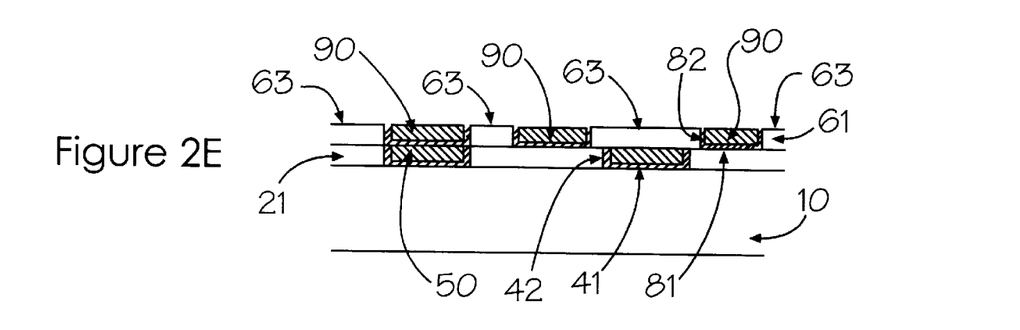
Figure 3A:
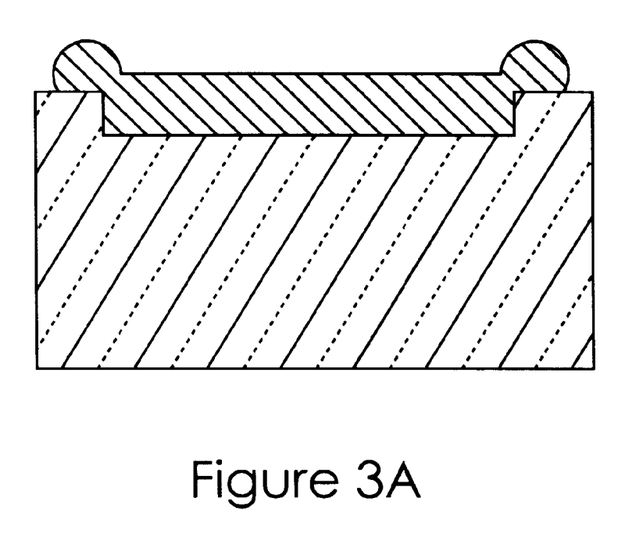
FIG. 3A is a cross-sectional view of a circuit line prior to the polishing of the glass plate, see step (g) below.
Figure 3B:
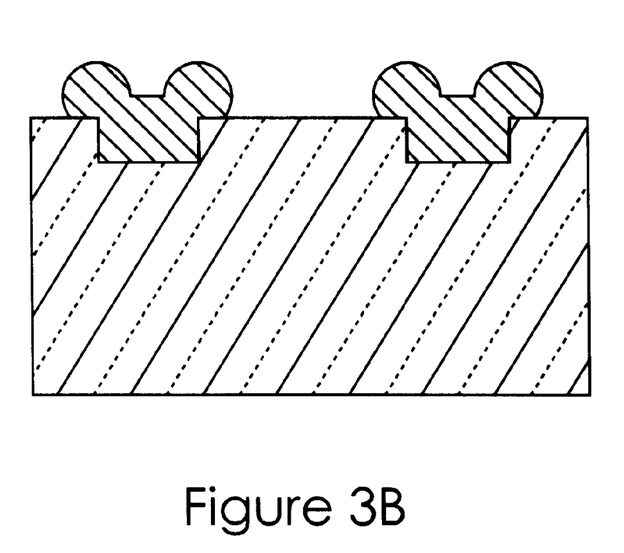
FIG. 3B is a front view of a circuit line before the polishing of the glass plate, see step (g) below.

FIG. 2E shows the resultant structure after electroless plating on the remaining seed layers on the bottoms 81 and sidewalls 82 of the openings 80 are filled with conductive material 90 having an upper surface 91.

WORKING EXAMPLE

The fabrication of a printed circuit board (PCB) by the present invention is described in the following general example. Prepreg sheets coated with a resin mix, used in this invention as the substrate for the microelectronic package, can be FR4, TEFLON®, or BT as supplied by IBM, Nelco and Rogers. The sheets are laminated on both sides with copper foil using a press. The total thickness of the substrate can range from 7 to 250 mils and is dependent on the requirements of the electronic package to be manufactured. The lamination press cycle can reach 180° C. under a pressure of 500 to 800 psi dependent upon material used and thickness required. Cores are usually higher pressure than composites. The copper foil is then removed from the substrate by etching to produce a desired dendritic surface on the resin/prepreg sheets. The etching is performed with cupric chloride solution in a conveyerized etch tool. The laminate surface is then coated with a photoresist such as T-168 supplied by DuPont or ASM supplied by Morton using a hot roll lamination or vacuum lamination technique. The photoresist must be able to withstand the subsequent electroless plating bath. The minimum thickness used for the photoresist is 1 mil. The photoresist is imaged using a glass or film master with an ultraviolet light source of 120 millijoules. The unexposed resist is then removed in a solution of propylene carbonate leaving behind the channels and images necessary to form the wiring layer. The imaged photoresist is then covered by a layer of seed material of palladium-tin with a thickness of 50–200Angstroms, in a vertical dip tank by conventional wet process methods. The topmost layer of the photoresist has the seed layer removed by feeding the package into a polishing tool. The polishing tool for this seed removal operation is performed using an apparatus described in U.S. patent application Ser. No. 08/704,193, filed Aug. 28, 1996 now U.S. Pat. No. 5,759,427 and herewith incorporated by reference. The polishing head of the tool will buff the seed surface using a 5 micron grip lapping film. The actual grinding surface on the polishing head can be of various types of lapping film having grits from 2 to 15 micron. The polishing head pressure is set at 12 psi, the head rotation is set at 600 rpm, and the conveyor speed is set at 30 inches per minute. The polishing operation is performed in a liquid bath being replenished at 1 gallon per minute. The liquid media is typically an aqueous media, preferably distilled water, but etchants can also be added to the aqueous media. These include dilute acids such as hydrochloric and bases such as sodium hydroxide. Concentrations of the etchants can range from 1 to 20% but most preferably are between 2 and 10%. The substrate is then placed in an electroless copper plating bath set at 72° C. to produce copper plating on the remaining seed layers found on the sidewalls and the bottom of the etched areas. The topmost surface of this electroless plated copper is then polished at 120 inches per minute with 1.2N cupric chloride solution at 12 psi using a 9 micron grit film at 600 rpm head rotation speed to remove any copper deformities. Finally, the photoresist mask is removed in a benzyl alcohol or propylene carbonate solution to leave the final PCB. It is understood that the above example represents preferred conditions for the grinding operation, values for concentrations, head pressure, head speed rotation, conveyor speed, grit size, and layer thickness may be varied by up to at least 50% without deleterious effect.

Since other modifications and changes varied to fit particular operating requirements and environments will be apparent to those skilled in the art, the invention is not considered limited to the examples chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. An electroless plating process for fabricating a substrate for primary printing of printed circuit wiring patterns, comprising the steps of:

a) bonding a copper foil to an insulating base by heat and pressure means;

b) removing said copper foil from said insulating base, thereby forming an adhesion promoting surface on said insulating base;

c) forming a resist layer on said adhesion promoting surface;

d) forming imagewise openings through said resist layer to a surface of said insulating base, said imagewise openings being defined by sidewalls and a bottom surface, thereby leaving undeveloped, upper resist surfaces;

e) depositing on said upper resist surfaces comprising said sidewalls and said bottom surface of said imagewise openings, a seed layer consisting essentially of a non-precious or noble metal and alloys therefrom;

f) selectively removing said seed layer from said upper surfaces of said resist layer by mechanical grinding in a liquid medium of said seed layer, while retaining seed layer portions in said imagewise openings defined by sidewall and bottom surfaces;

g) depositing, by a non-electrolytic process, a conductive material onto the surface of the retained seed layer portions in said imagewise openings, and h) chemically polishing said conductive material.

2. The process as described in claim 1, further comprising the additional step of:

h) chemically polishing said conductive material.

3. The process as described in claim 2, further comprising the additional step of:

i) removing said resist layer after depositing said conductive material.

4. The process as described in claim 1, wherein said liquid medium comprises a chemical etchant.

5. The process as described in claim 4, wherein said chemical etchant is dilute hydrochloric acid.

6. The process as described in claim 4, wherein said chemical etchant is dilute sodium hydroxide.

7. The process as described in claim 5, wherein said non-precious or noble metal and alloys comprises Pd/Sn.

8. The process for fabricating composite laminate substrates as recited in claim 2, further comprising the steps of:

i) forming a second resist layer on a topmost surface of said substrate;

j) forming imagewise openings through said second resist layer to said substrate;

k) depositing on remaining upper surfaces of said second resist layer, and sidewall and bottom surfaces of said imagewise openings from step (j), a seed layer consisting essentially of a palladium alloy;

l) selectively removing portions of said seed layer from step (k) from said upper surface of said second resist layer, while retaining said seed layer in said imagewise openings from step (j);

m) depositing onto said seed layer from step (j) in said sidewalls and bottom surfaces thereof, a conductive material; and n) repeating steps (i) through (m) on a topmost surface of the substrate to fabricate a composite laminate.

* * * * *